United States Patent
Eeh et al.

(10) Patent No.: US 10,170,519 B2
(45) Date of Patent: Jan. 1, 2019

(54) MAGNETORESISTIVE ELEMENT AND MEMORY DEVICE

(71) Applicant: Toshiba Memory Corporation, Minato-ku, Tokyo (JP)

(72) Inventors: Youngmin Eeh, Seongnam-si (KR); Toshihiko Nagase, Seoul (KR); Daisuke Watanabe, Seoul (KR); Koji Ueda, Yokkaichi Mie (JP); Makoto Nagamine, Seoul (KR); Kazuya Sawada, Seoul (KR)

(73) Assignee: TOSHIBA MEMORY CORPORATION, Tokyo (JP)

( * ) Notice: Subject to any disclaimer, the term of this patent is extended or adjusted under 35 U.S.C. 154(b) by 35 days.

(21) Appl. No.: 15/261,755

(22) Filed: Sep. 9, 2016

(65) Prior Publication Data
US 2017/0263676 A1    Sep. 14, 2017

Related U.S. Application Data

(60) Provisional application No. 62/308,120, filed on Mar. 14, 2016.

(51) Int. Cl.
| | |
|---|---|
| *G11C 11/16* | (2006.01) |
| *H01L 27/22* | (2006.01) |
| *H01L 43/02* | (2006.01) |
| *H01L 43/10* | (2006.01) |
| *H01L 49/02* | (2006.01) |

(52) U.S. Cl.
CPC .......... *H01L 27/228* (2013.01); *G11C 11/161* (2013.01); *H01L 28/00* (2013.01); *H01L 43/02* (2013.01); *H01L 43/10* (2013.01)

(58) Field of Classification Search
None
See application file for complete search history.

(56) References Cited

U.S. PATENT DOCUMENTS

| | | | |
|---|---|---|---|
| 8,750,029 B2 | 6/2014 | Kitagawa et al. | |
| 2014/0021426 A1 | 1/2014 | Lee et al. | |
| 2016/0072045 A1* | 3/2016 | Kanaya | H01L 43/08 257/427 |
| 2016/0099288 A1* | 4/2016 | Watanabe | H01L 27/228 257/295 |

FOREIGN PATENT DOCUMENTS

JP    2013008865 A    1/2013

* cited by examiner

*Primary Examiner* — Cory W Eskridge
(74) *Attorney, Agent, or Firm* — Holtz, Holtz & Volek PC

(57) ABSTRACT

According to one embodiment, a magnetoresistive element includes a first metal layer having a body-centered cubic structure, a second metal layer having a hexagonal close-packed structure on the first metal layer, a metal nitride layer on the second metal layer, a first magnetic layer on the metal nitride layer, an insulating layer on the first magnetic layer, and a second magnetic layer on the insulating layer.

17 Claims, 9 Drawing Sheets

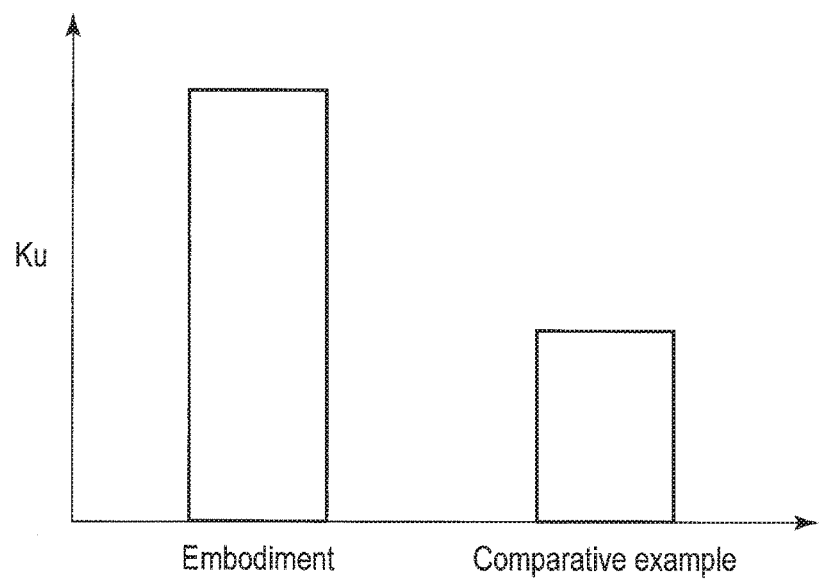
F I G. 7
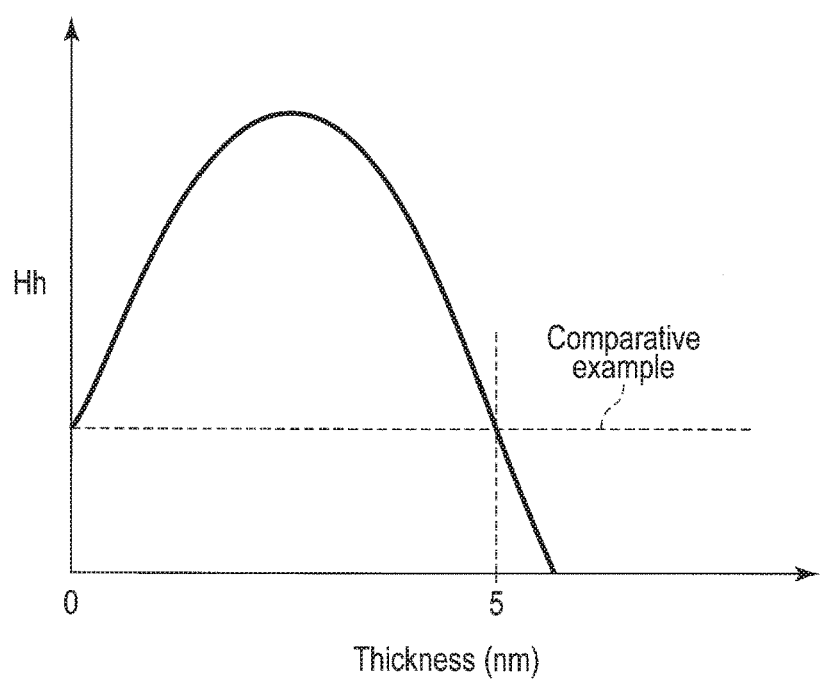
F I G. 8

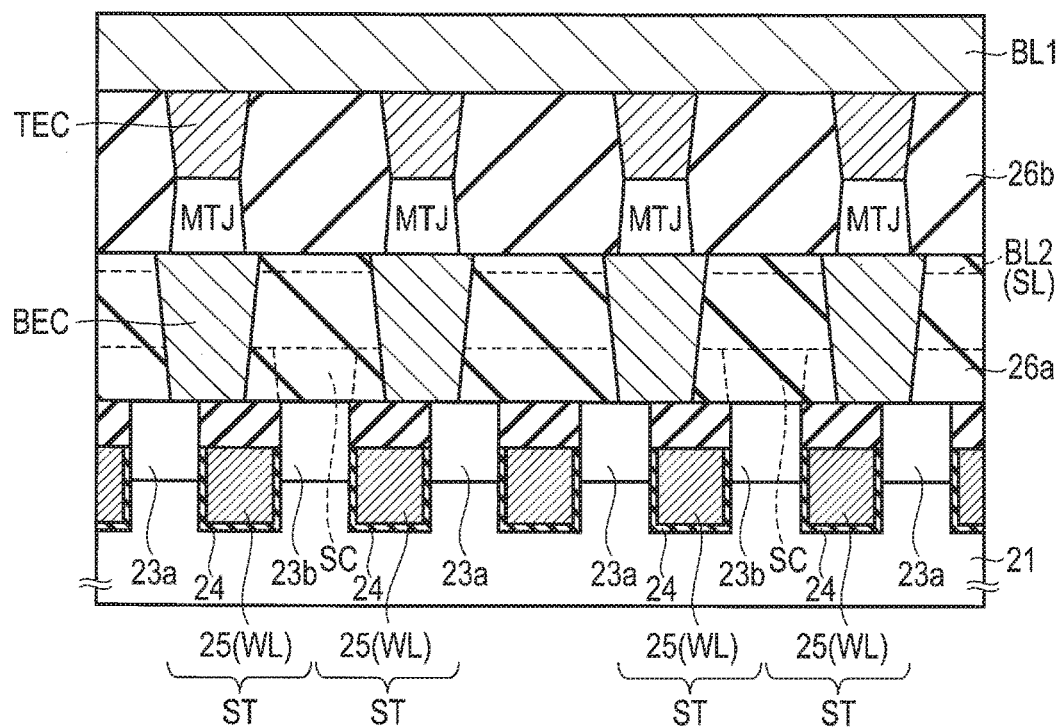
F I G. 13
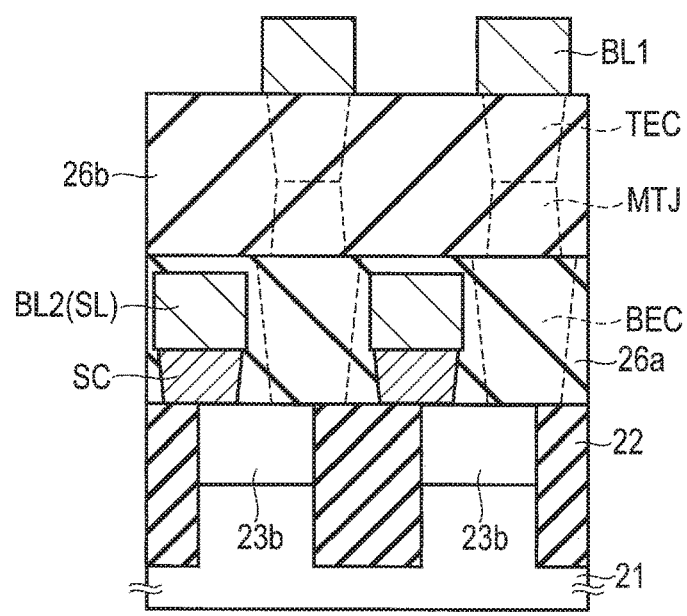
F I G. 14

US 10,170,519 B2

MAGNETORESISTIVE ELEMENT AND MEMORY DEVICE

CROSS-REFERENCE TO RELATED APPLICATIONS

This application claims the benefit of U.S. Provisional Application No. 62/308,120, filed Mar. 14, 2016, the entire contents of which are incorporated herein by reference.

FIELD

Embodiments described herein relate generally to a magnetoresistive element and a memory device.

BACKGROUND

Magnetoresistive elements are used for, for example, memory cells of spin-transfer-torque magnetic random access memories (STT-MRAMs) and magnetic heads of hard disk drives (HDDs). In these memory devices, an improvement in the magnetoresistive ratio, a reduction in the magnetization reversal current, and an improvement in thermal stability of the magnetoresistive elements are necessary to make them practicable.

BRIEF DESCRIPTION OF THE DRAWINGS

FIG. 7 is a diagram showing advantages related to magnetic anisotropy.
FIG. 8 is a diagram showing a relationship between the thickness of a first metal layer and the magnetic anisotropy of a first magnetic layer.
FIG. 13 is a sectional view along line XIII-XIII of FIG. 12.
FIG. 14 is a sectional view along line XIV-XIV of FIG. 12.

DETAILED DESCRIPTION

In general, according to one embodiment, a magnetoresistive element comprises: a first metal layer having a body-centered cubic structure; a second metal layer having a hexagonal close-packed structure on the first metal layer; a metal nitride layer on the second metal layer; a first magnetic layer on the metal nitride layer; an insulating layer on the first magnetic layer; and a second magnetic layer on the insulating layer.

1. Magnetoresistive Element

For example, if a magnetoresistive element has a stacked layer structure of a first magnetic layer, an insulating layer, and a second magnetic layer, the magnetoresistive ratio, the magnetization reversal current, and the thermal stability of the magnetoresistive element depend on the crystalline texture or the magnetic anisotropy of the first and second magnetic layers. Therefore, the crystalline texture or the magnetic anisotropy of a foundation layer to be an underlying layer of the first and second magnetic layers is important.

The structure of the foundation layer which can improve the crystalline texture or the magnetic anisotropy of the first and second magnetic layers will be described hereinafter.

(1) First Embodiment

Figure 1:
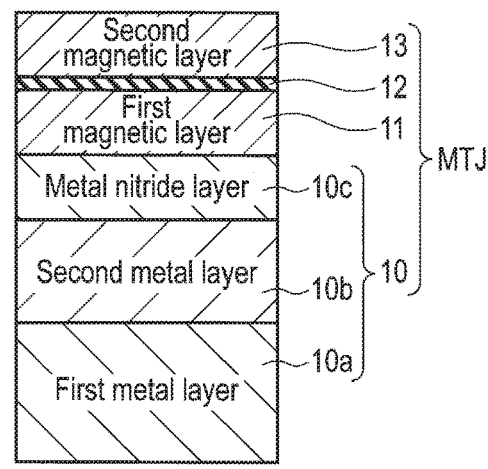
FIG. 1 is a diagram showing a first embodiment of a magnetoresistive element.

FIG. 1 shows a first embodiment of the magnetoresistive element.

A magnetoresistive element MTJ comprises a foundation layer 10, a first magnetic layer 11 on the foundation layer 10, an insulating layer 12 on the first magnetic layer 11, and a second magnetic layer 13 on the insulating layer 12.

One of the first and second magnetic layers 11 and 13 is a reference layer having invariable magnetization, and the other is a storage layer having variable magnetization.

Here, the invariable magnetization means that a magnetization direction does not vary before or after writing, and the variable magnetization means that the magnetization direction can be reversed before or after writing.

Further, the writing means spin-transfer-torque writing in which a spin-transfer-torque current (spin-polarized electron) is passed to the magnetoresistive element MTJ, thereby imparting a spin torque to the magnetization of a storage layer.

If the first magnetic layer 11 is a storage layer and the second magnetic layer 13 is a reference layer, the magnetoresistive element MTJ is referred to as a top-pin type. In addition, if the first magnetic layer 11 is a reference layer and the second magnetic layer 13 is a storage layer, the magnetoresistive element MTJ is referred to as a bottom-pin type.

It is preferable that each of the first and second magnetic layers 11 and 13 has an axis of easy magnetization in a direction perpendicular to a film surface, that is, perpendicular magnetic anisotropy. Here, the film surface is an interface between the first magnetic layer 11, the insulating layer 12, and the second magnetic layer 13. That is, the direction perpendicular to the film surface is a direction in which the first and second magnetic layers 11 and 13 are stacked.

However, each of the first and second magnetic layers 11 and 13 may have the axis of easy magnetization in a direction parallel to the film surface, that is, in-plane magnetic anisotropy.

The resistance of the magnetoresistive element MTJ varies depending on the relative magnetization directions of a storage layer and a reference layer because of the magnetoresistive effect. For example, the resistance of the magnetoresistive element MTJ is low in a parallel state in which the magnetization directions of the storage layer and the reference layer are the same, and high in an antiparallel state in which the magnetization directions of the storage layer and the reference layer are opposite to each other.

The first and second magnetic layers 11 and 13 comprise, for example, CoFeB, MgFeO or FeB.

The first and second magnetic layers 11 and 13 may comprise TbCoFe having perpendicular magnetic anisotropy, a Co/Pt-superlattice, $L_{1_o}$-ordered FePt, or the like. In this case, it is preferable that CoFeB or FeB as an interfacial layer be provided between the first magnetic layer 11 and the insulating layer 12, or between the insulating layer 12 and the second magnetic layer 13.

For example, it is preferable that both in the top-pin type and the bottom-pin type, a magnetic layer to be a storage layer of the first and second magnetic layers 11 and 13 include CoFeB or FeB, and a magnetic layer to be a reference layer include CoPt, CoNi, or CoPd.

The first and second magnetic layers 11 and 13 may include impurities (element), for example, Mo, W, Ta, Zr, Hf, Cr, or V. In this case, the saturation magnetization Ms of the first and second magnetic layers 11 and 13 can be made small, and thus, a contribution can be made to a reduction in the magnetization reversal current.

The insulating layer 12 comprises, for example, MgO or AlO. The insulating layer 12 may be oxide of Al, Si, Be, Mg, Ca, Sr, Ba, Sc, Y, La, Zr, Hf, or the like. If MgO is used for the insulating layer 12, its thickness is set to be 1 nm or less because of a restriction on resistance.

If each of the first and second magnetic layers 11 and 13 comprises CoFeB and the insulating layer 12 comprises MgO, each of the first and second magnetic layers 11 and 13 changes from an amorphous state to, for example, a body-centered cubic (BCC) structure in which a film surface is oriented in a (001)-surface by heat treatment at a high temperature and for a short time. However, the insulating layer 12 has an NaCl structure in which a film surface is oriented in a (001)-surface.

Here, the structure of the foundation layer 10 is an important factor in improving the crystalline texture or the magnetic anisotropy of the first and second magnetic layers 11 and 13.

The foundation layer 10 comprises a first metal layer 10a having a BCC structure, a second metal layer 10b having a hexagonal close-packed (hcp) structure on the first metal layer 10a, and a metal nitride layer 10c on the second metal layer 10b. It is preferable that the metal nitride layer 10c have an hcp structure.

The first metal layer 10a promotes the crystalline texture of the second metal layer 10b. For this reason, the first metal layer 10a comprises one of Nb, Mo, Ta, Cr, and V, and has a BCC structure. In addition, it is preferable that the first metal layer 10a have a thickness of 5 nm or less.

In order to promote the crystalline texture of the second metal layer 10b, it is preferable that the first metal layer 10a have a thickness of 0.5 nm or more. In consideration of its magnetic anisotropy (which will be described later) and surface roughness, it is preferable that the first metal layer 10a have a thickness of 4.5 nm or less.

In addition, if the thickness of the first metal layer 10a exceeds 5 nm, the total thickness of the magnetoresistive element MTJ increases and a processing problem occurs. Thus, it is unpreferable.

The second metal layer 10b promotes the crystalline texture of the metal nitride layer 10c. For this reason, the second metal layer 10b comprises one of Zn, Ru, Hf, and Zr, and has an hcp structure. In addition, it is preferable that the second metal layer 10b have a thickness between 2 and 20 nm.

The lower limit (2 nm) of the thickness of the second metal layer 10b is the minimum thickness necessary to promote the crystalline texture of the metal nitride layer 10c. The upper limit (20 nm) of the thickness of the second metal layer 10b is set in consideration of the total thickness of the magnetoresistive element MTJ and the roughness of an upper surface of the second metal layer 10b.

That is, if the thickness of the second metal layer 10b exceeds 20 nm, the total thickness of the magnetoresistive element MTJ increases and a processing problem occurs. Also, in this case, the roughness of the upper surface of the second metal layer 10b increases and it becomes hard to promote the crystalline texture of the metal nitride layer 10c.

The metal nitride layer 10c promotes the crystalline texture of the first magnetic layer 11, and improves the magnetic anisotropy of the first magnetic layer 11.

For this reason, the metal nitride layer 10c comprises a nitrogen compound of, for example, magnesium nitride (MgN), zirconium nitride (ZrN), niobium nitride (NbN), silicon nitride (SiN), aluminum nitride (AlN), hafnium nitride (HfN), tantalum nitride (TaN), tungsten nitride (WN), chromium nitride (CrN), molybdenum nitride (MoN), titanium nitride (TiN), or vanadium nitride (VN).

The metal nitride layer 10c may include an oxygen compound of, for example, magnesium oxide (MgO). Further, the metal nitride layer 10c may be, for example, a mixture of the nitrogen compound and the oxygen compound. Moreover, the metal nitride layer 10c is not limited to a binary compound including two kinds of element and may be a ternary compound including three kinds of element, for example, aluminum titanium nitride (AlTiN).

In addition, the metal nitride layer 10c has, for example, an hcp structure.

The metal nitride layer 10c may include impurities (element), for example, Ti. In addition, it is preferable that the metal nitride layer 10c have a thickness between 0.4 and 2 nm.

The lower limit (0.4 nm) of the thickness of the metal nitride layer 10c is the minimum thickness necessary to promote the crystalline texture of the first magnetic layer 11 and improve the magnetic anisotropy of the first magnetic layer 11. The upper limit (2 nm) of the thickness of the metal nitride layer 10c is set in consideration of the total thickness of the magnetoresistive element MTJ and the roughness of an upper surface of the metal nitride layer 10c.

That is, if the thickness of the metal nitride layer 10c exceeds 2 nm, the total thickness of the magnetoresistive element MTJ increases and a processing problem occurs. Also, in this case, the roughness of the upper surface of the metal nitride layer 10c increases and it becomes hard to promote the crystalline texture of the first magnetic layer 11 and improve the magnetic anisotropy of the first magnetic layer 11.

The metal nitride layer 10c also has the function of reducing a damping constant of the first magnetic layer 11 and reducing a magnetization reversal current.

According to the above-described structure, in annealing, which causes the first and second magnetic layers 11 and 13 to change from being amorphous to being crystalline, the foundation layer 10 supports the crystallization of the first and second magnetic layers 11 and 13, and thus, the crystalline texture or the magnetic anisotropy of the first and second magnetic layers 11 and 13 can be improved.

Therefore, according to the first embodiment, an improvement in the magnetoresistive ratio, a reduction in the magnetization reversal current, and an improvement in thermal stability can be achieved.

(2) Second Embodiment

Figure 2:
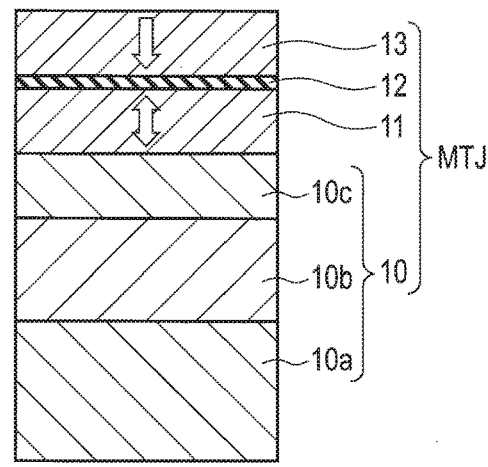
FIG. 2 is a diagram showing a second embodiment of the magnetoresistive element.

FIG. 2 shows a second embodiment of the magnetoresistive element.

The second embodiment is a modification of the first embodiment.

In comparison with the first embodiment, the second embodiment is characterized in that first and second magnetic layers 11 and 13 have perpendicular magnetic anisotropy, and a magnetoresistive element MTJ is a top-pin type. The other points are the same as in the first embodiment. Accordingly, the same elements as those of the first embodiment will be given the same reference numbers, and a detailed description thereof will be omitted.

The first magnetic layer 11 has perpendicular and variable magnetization, and the second magnetic layer 13 has perpendicular and invariable magnetization.

In the present embodiment, the magnetization of the second magnetic layer 13 is directed toward the first magnetic layer 11 side. However, the magnetization of the second magnetic layer 13 may be directed toward the opposite side to the first magnetic layer 11 side instead.

According to the second embodiment, an improvement in the magnetoresistive ratio, a reduction in the magnetization reversal current, and an improvement in thermal stability can be achieved by an improvement in the crystalline texture or the perpendicular magnetic anisotropy of the first and second magnetic layers 11 and 13.

(3) Third Embodiment

Figure 3:
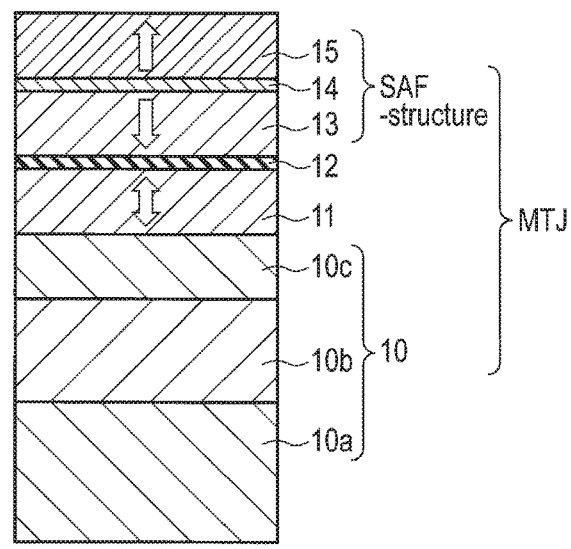
FIG. 3 is a diagram showing a third embodiment of the magnetoresistive element.

FIG. 3 shows a third embodiment of the magnetoresistive element.

The third embodiment is a modification of the second embodiment.

In comparison with the second embodiment, the third embodiment is characterized in that a third magnetic layer (shift canceling layer) 15 is disposed above a second magnetic layer 13. The other points are the same as in the second embodiment. Accordingly, the same elements as those of the second embodiment will be given the same reference numbers, and a detailed description thereof will be omitted.

A first magnetic layer 11 has perpendicular and variable magnetization, and the second and third magnetic layers 13 and 15 have perpendicular and invariable magnetization. A third metal layer 14 is disposed between the second and third magnetic layers 13 and 15.

The third metal layer 14 comprises, for example, one of Pt, Ta, and Ru.

The third magnetic layer 15 has a magnetization direction opposite to that of the second magnetic layer 13. For example, the second and third magnetic layers 13 and 15 are synthetic antiferromagnetic (SAF)-coupled via the third metal layer 14. This structure is called an SAF-structure.

The third magnetic layer 15 cancels a shift of a magnetization reversal characteristic (hysteresis curve) of the first magnetic layer 11 due to a stray magnetic field from the second magnetic layer 13. It is preferable that the third magnetic layer 15 comprise, for example, CoPt, CoNi, or CoPd. The third magnetic layer 15 comprises, for example, a structure [Co/Pt]n in which Co layers and Pt layers are stacked in n layers.

In the present embodiment, the magnetization of the second and third magnetic layers 13 and 15 is directed toward the third metal layer 14 side. However, the magnetization of the second and third magnetic layers 13 and 15 may be directed toward the opposite side to the third metal layer 14 side instead.

According to the third embodiment, a further improvement in the characteristics of a magnetoresistive element MTJ can be achieved by an improvement in the crystalline texture or the perpendicular magnetic anisotropy of the third magnetic layer 15, in addition to the advantages of the second embodiment.

(4) Fourth Embodiment

Figure 4:
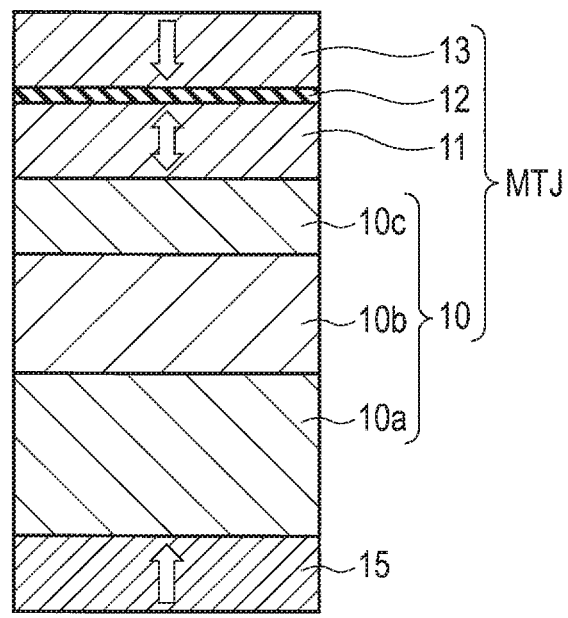
FIG. 4 is a diagram showing a fourth embodiment of the magnetoresistive element.

FIG. 4 shows a fourth embodiment of the magnetoresistive element.

The fourth embodiment is a modification of the third embodiment.

In comparison with the third embodiment, the fourth embodiment is characterized in that a third magnetic layer 15 as a shift canceling layer is disposed directly under a foundation layer 10. The other points are the same as in the third embodiment. Accordingly, the same elements as those of the third embodiment will be given the same reference numbers, and a detailed description thereof will be omitted.

The third magnetic layer 15 is disposed directly under the foundation layer 10. The third magnetic layer 15 has a magnetization direction opposite to that of a second magnetic layer 13.

In the present embodiment, the magnetization of the second and third magnetic layers 13 and 15 is directed toward the foundation layer 10 side. However, the magnetization of the second and third magnetic layers 13 and 15 may be directed toward the opposite side to the foundation layer 10 side instead.

According to the fourth embodiment, a further improvement in the characteristics of a magnetoresistive element MTJ can be achieved by canceling a shift of a magnetization reversal characteristic of a first magnetic layer 11.

(5) Fifth Embodiment

Figure 5:
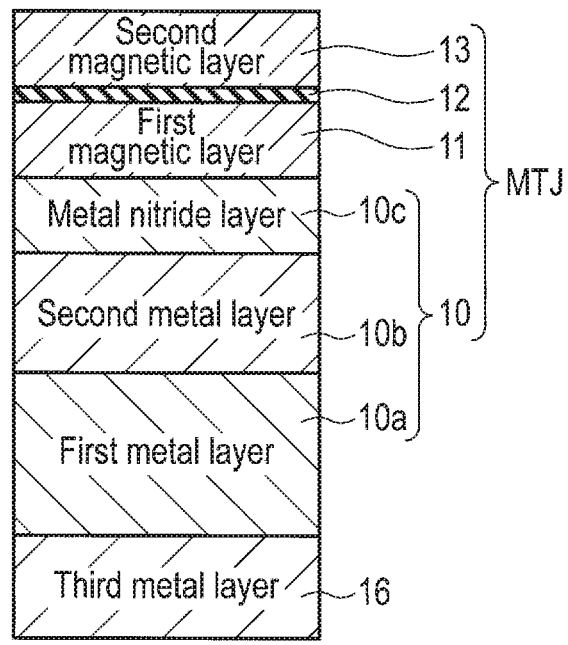
FIG. 5 is a diagram showing a fifth embodiment of the magnetoresistive element.

FIG. 5 shows a fifth embodiment of the magnetoresistive element.

The fifth embodiment is a modification of the first embodiment.

In comparison with the first embodiment, the fifth embodiment is characterized in that a third metal layer 16 is disposed directly under a foundation layer 10. The other points are the same as in the first embodiment. Accordingly, the same elements as those of the first embodiment will be given the same reference numbers, and a detailed description thereof will be omitted.

The third metal layer 16 is disposed directly under the foundation layer 10. The third metal layer 16 functions as, for example, an electrode, a contact plug, or an interconnect. Here, the third metal layer 16 may have a crystalline structure or an amorphous structure. The third metal layer 16 comprises, for example, one of Al, Be, Mg, Ca, Sr, Ba, Sc, Y, La, Ti, Zr, and Hf, or an alloy including one of them.

According to the fifth embodiment, as in the first embodiment, an improvement in the magnetoresistive ratio, a reduction in the magnetization reversal current, and an improvement in thermal stability can be achieved by an improvement in the crystalline texture or the magnetic anisotropy of first and second magnetic layers 11 and 13.

(6) Sixth Embodiment

Figure 6:
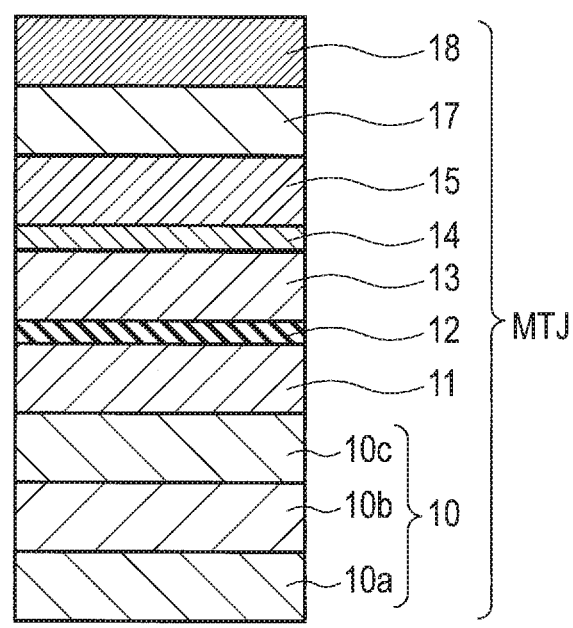
FIG. 6 is a diagram showing a sixth embodiment of the magnetoresistive element.

FIG. 6 shows a sixth embodiment of the magnetoresistive element.

The sixth embodiment relates to a structure effective in improving the characteristics of a magnetoresistive element MTJ.

In a foundation layer 10, a first metal layer 10a comprises, for example, Mo, Ta, Cr, or V, a second metal layer 10b comprises, for example, Zn, Ru, Hf, or Zr, and a metal nitride layer 10c comprises, for example, a material exemplified in the above-described first embodiment.

A first magnetic layer 11, for example, functions as a storage layer and comprises CoFeB. An insulating layer 12, for example, functions as a tunnel barrier layer and comprises MgO. A second magnetic layer 13, for example, functions as a reference layer and comprises CoFeB. The second magnetic layer 13 may comprise Ta, Co, or a stacked layer of them.

A third metal layer 14 comprises, for example, Ru. A third magnetic layer 15, for example, functions as a shift canceling layer and includes CoPt, CoNi, or CoPd.

A cap layer 17 comprises Pt, W, Ru, or the like. A hard mask layer 18 comprises, for example, W, Ta, TiN, or a mixed material of them.

According to the sixth embodiment, the advantages of the first embodiment can be exercised to the maximum.

(7) Advantages

FIG. 7 shows advantages related to magnetic anisotropy (thermal stability).

In the figure, the embodiments are the magnetic anisotropy energy Ku (erg/cm$^3$) of the first magnetic layer 11 in the case where the structure of FIG. 1 is used, and a comparative example is the magnetic anisotropy energy Ku of the first magnetic layer 11 in the case where the first metal layer 10a is omitted from the structure of FIG. 1.

As is clear from the figure, the magnetic anisotropy energy Ku of the first magnetic layer 11 can be increased by the first metal layer 10a.

FIG. 8 shows a relationship between the thickness of a first metal layer and the magnetic anisotropy of a first magnetic layer.

In the figure, the horizontal axis represents the thickness [nm] of the first metal layer 10a in the structure of FIG. 1, and the vertical axis represents the magnetic anisotropy Hk of the first magnetic layer 11 in the structure of FIG. 1.

As is clear from the figure, in a range in which the thickness of the first metal layer 10a is 5 nm or less, the magnetic anisotropy Hk of the first magnetic layer 11 can be increased in comparison with a comparative example (in which the first metal layer 10a does not exist). In consideration of manufacturing tolerance, etc., a preferable range of the thickness of the first metal layer 10a is 0.5 to 4.5 nm.

Figure 9:
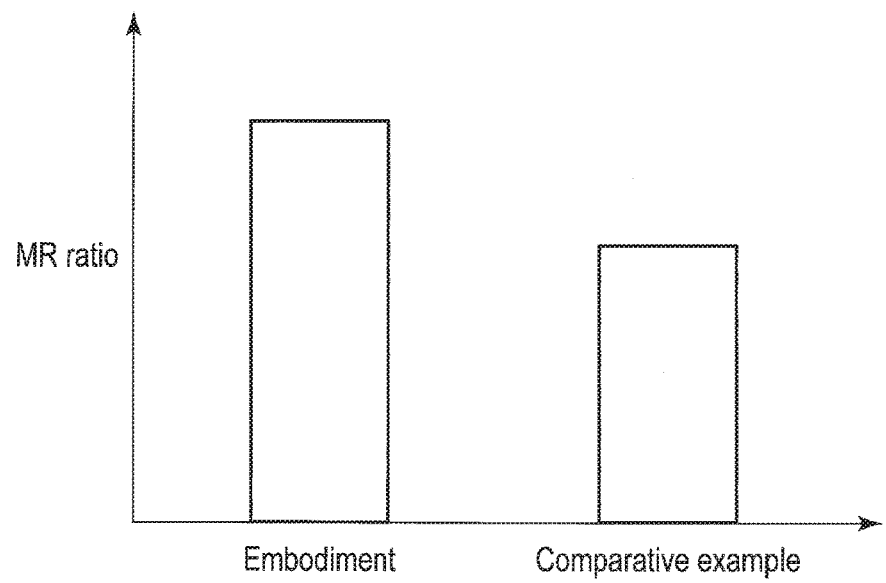
FIG. 9 is a diagram showing advantages related to a magnetoresistive ratio.

FIG. 9 shows advantages related to a magnetoresistive ratio.

In the figure, the embodiments are the magnetoresistive ratio (%) of the magnetoresistive element MTJ in the case where the structure of FIG. 1 is used, and a comparative example is the magnetoresistive ratio of the magnetoresistive element MTJ in the case where the first metal layer 10a is omitted from the structure of FIG. 1.

As is clear from the figure, the crystalline texture of the first magnetic layer 11 can be improved by the first metal layer 10a (a good tunnel junction interface can be formed), and thus, an improvement in the magnetoresistive ratio due to a spin filter effect can be achieved.

Figure 10:
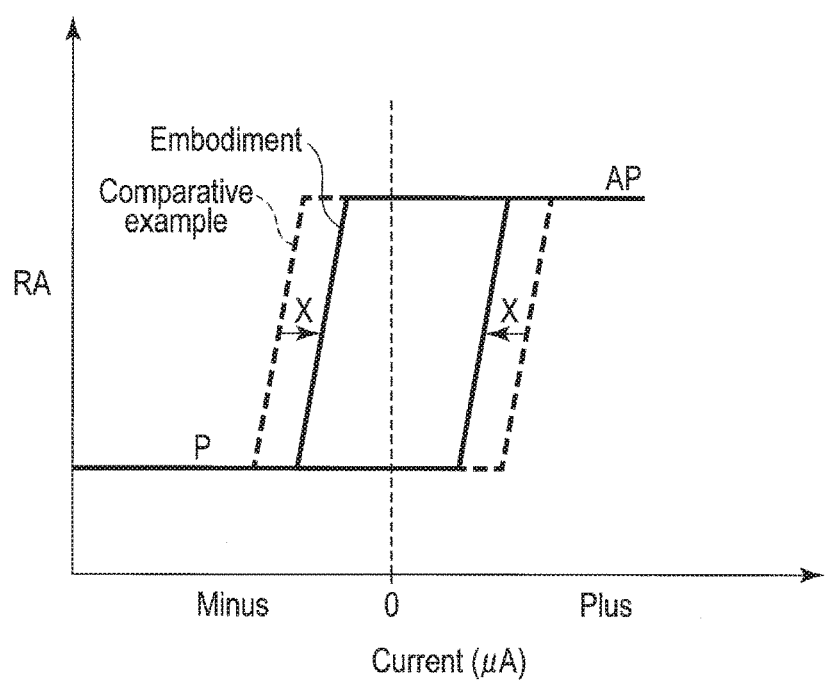
FIG. 10 is a diagram showing advantages related to a magnetization reversal current.

FIG. 10 shows advantages related to a magnetization reversal current.

In the figure, the horizontal axis represents the current (µA) flowing through the magnetoresistive element, and the vertical axis represents the resistance RA (resistance-area product) of the magnetoresistive element standardized per unit area (1 µm$^2$).

In addition, the embodiments are a hysteresis curve in the case where the structure of FIG. 1 is used, and a comparative example is a hysteresis curve in the case where the first metal layer 10a is omitted from the structure of FIG. 1.

As is clear from the figure, the crystalline texture of the first magnetic layer 11 can be improved by the first metal layer 10a, and thus, saturation magnetization Ms or a damping constant can be reduced.

Accordingly, the magnetization reversal current can be reduced by X.

2. Memory Device

An example of a memory device comprising the above-described magnetoresistive element will be described.

Figure 11:
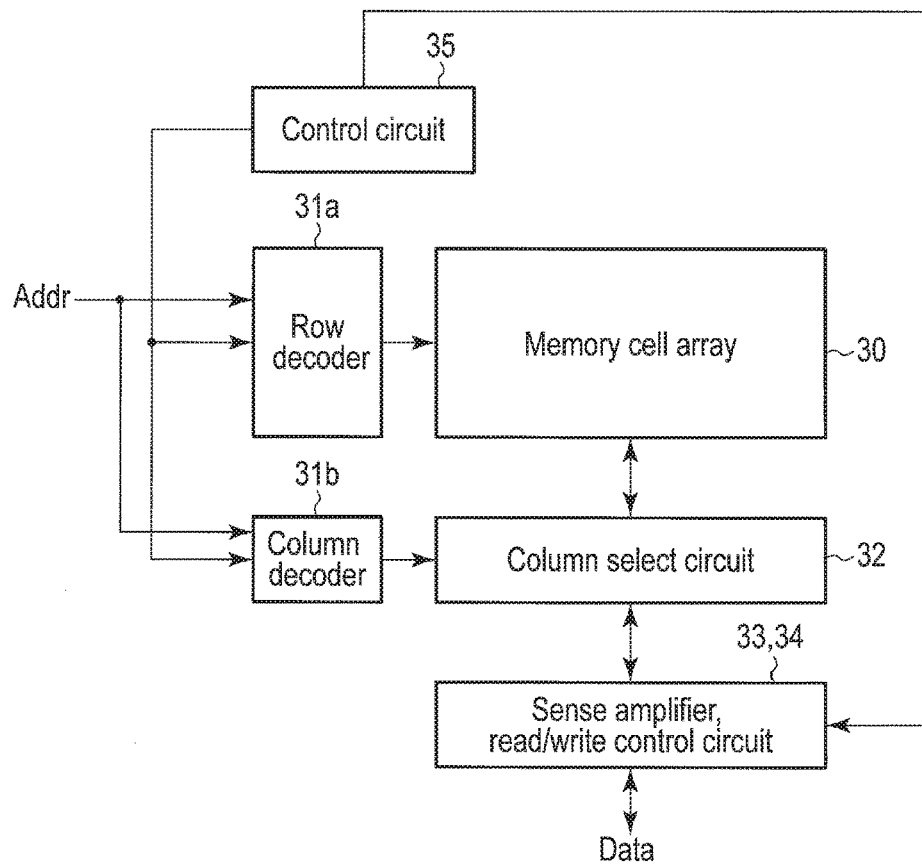
FIG. 11 is a diagram showing an MRAM as a memory device.

FIG. 11 shows an MRAM as the memory device.

A memory cell array 30 comprises memory cells (magnetoresistive elements). A row decoder 31a and a column decoder 31b randomly access one of the memory cells of the memory cell array 30 based on an address signal Addr.

A column select circuit 32 has the function of electrically connecting the memory cell array 30 and a sense amplifier 33 to each other based on a signal from the column decoder 31b.

A read/write control circuit 34 supplies a read current to selected one memory cell of the memory cell array 30 at the time of reading. The sense amplifier 33 identifies data stored in the selected one memory cell by detecting the read current.

In addition, the read/write control circuit 34 writes data to a selected one memory cell of the memory cell array 30 by supplying a write current to the selected one memory at the time of writing.

A control circuit 35 controls the operation of the row decoder 31a, the column decoder 31b, the sense amplifier 33, and the read/write control circuit 34.

Figure 12:
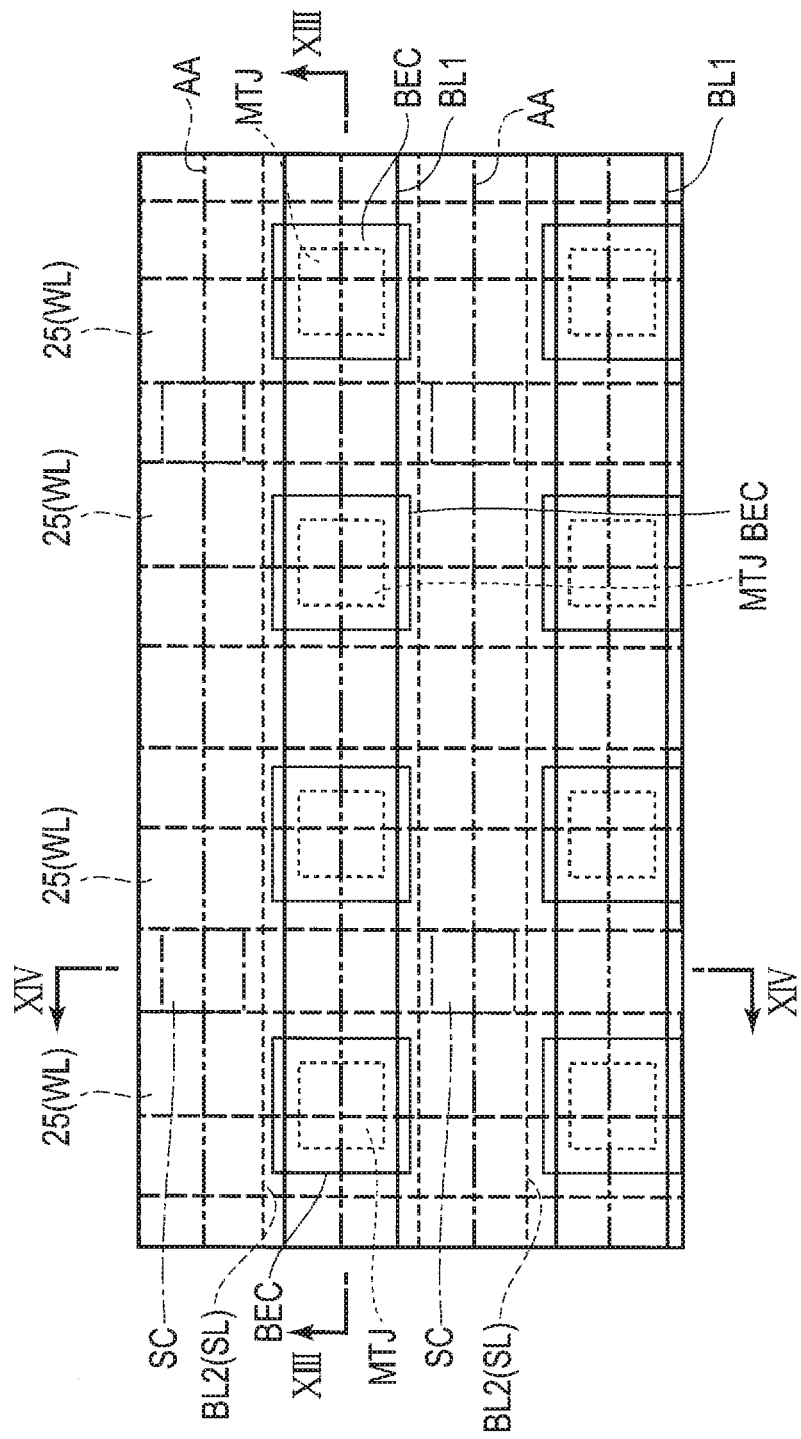
FIG. 12 is a diagram showing memory cells of the MRAM.

FIG. 12 to FIG. 14 shows the memory cells of the MRAM. FIG. 12 is a plan view of the memory cells of the MRAM, FIG. 13 is a sectional view along line XIII-XIII of FIG. 12, and FIG. 14 is a sectional view along line XIV-XIV of FIG. 12.

In the present example, the memory cells of the magnetic memory comprise a select transistor (for example, an FET) ST and a magnetoresistive element MTJ.

The select transistor ST is disposed in an active area AA in a semiconductor substrate 21. The active area AA is surrounded by an element isolation insulating layer 22 in the semiconductor substrate 21. In the present example, the element isolation insulating layer 22 has a shallow trench isolation (STI) structure.

The select transistor ST comprises source/drain diffusion layers 23a and 23b in the semiconductor substrate 21, a gate insulating layer 24 and a gate electrode (word line) 25 formed therebetween in the semiconductor substrate 21. The select transistor ST of the example has the so-called buried gate structure in which the gate electrode 25 is buried in the semiconductor substrate 21.

An interlayer insulating layer (for example, a silicon oxide layer) 26a covers the select transistor ST. Contact plugs BEC and SC are disposed in the interlayer insulating layer 26a. The contact plug BEC is connected to the source/drain diffusion layer 23a, and the contact plug SC is connected to the source/drain diffusion layer 23b. The contact plugs BEC and SC include, for example, one of W, Ta, Ru, Ti, TiN, and TaN.

The magnetoresistive element MTJ is disposed on the contact plug BEC. The magnetoresistive element MTJ is the magnetoresistive element according to the above-described first to sixth embodiments.

A contact plug TEC is disposed on the magnetoresistive element MTJ. The contact plug TEC includes, for example, one of W, Ta, Ru, Ti, TiN, and TaN. An interlayer insulating layer (for example, a silicon oxide layer) 26b covers the magnetoresistive element MTJ.

A bit line BL1 is connected to the magnetoresistive element MTJ via the contact plug TEC. A bit line BL2 is connected to the source/drain diffusion layer 23b via the contact plug SC. The bit line BL2 also functions as, for example, a source line SL to which ground potential is applied at the time of reading.

3. Manufacturing Method

Figure 15:
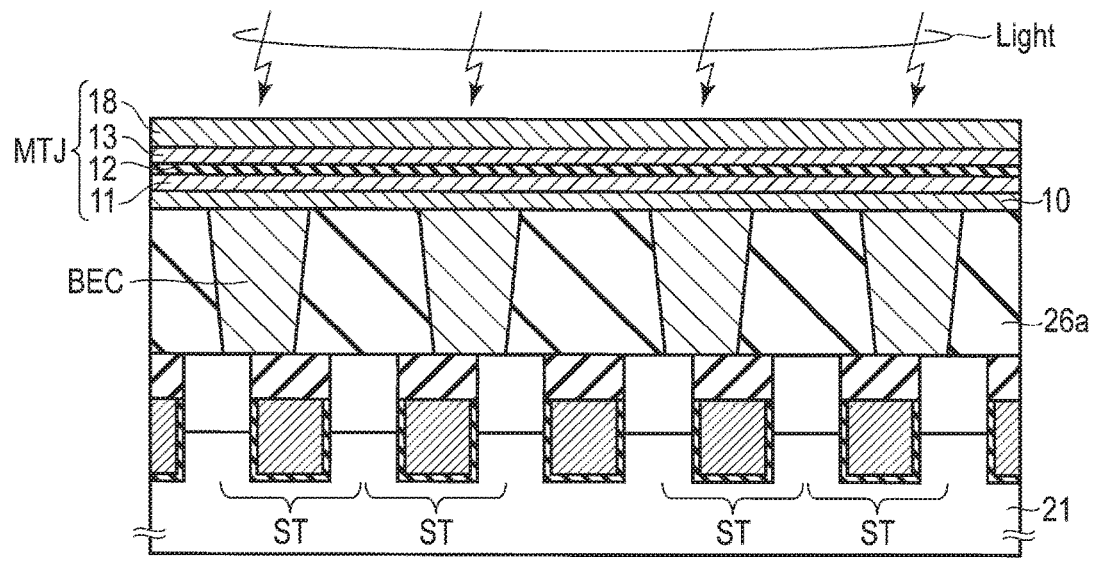
FIG. 15 and FIG. 16 are diagrams showing a manufacturing method of the MRAM of FIG. 12 to FIG. 14.
Figure 16:
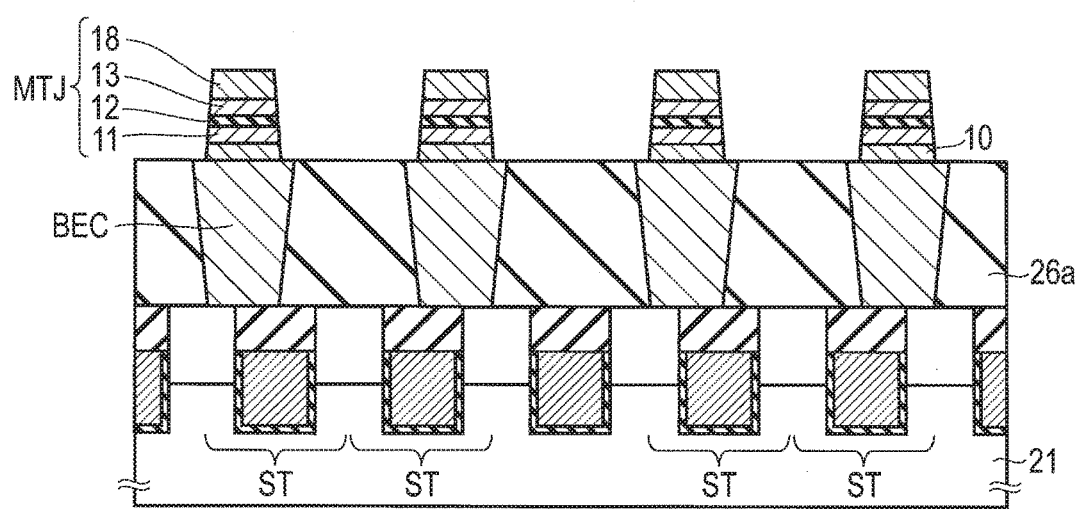

FIG. 15 and FIG. 16 show a manufacturing method of the MRAM of FIG. 12 to FIG. 14.

First, as shown in FIG. 15, the select transistor ST having a buried gate structure is formed in the semiconductor substrate 21. In addition, the interlayer insulating layer 26a is formed, and the contact plug BEC is formed in the interlayer insulating layer 26a.

Thereafter, a stacked layer structure comprising the foundation layer 10, the first magnetic layer 11, the insulating layer 12, the second magnetic layer 13, and the hard mask layer 18 is formed on the interlayer insulating layer 26a and the contact plug BEC.

Then, the first and second magnetic layers 11 and 13 are crystallized by, for example, lamp annealing. At this time, since the foundation layer 10 exists, the crystalline texture and the magnetic anisotropy of the first and second magnetic layers 11 and 13 can be improved.

Next, as shown in FIG. 16, the hard mask layer 18 is patterned by a photoengraving process (PEP) and an RIE process. In addition, with the hard mask layer 18 used as a mask, the foundation layer 10, the first magnetic layer 11, the insulating layer 12, and the second magnetic layer 13 are patterned by physical etching such as ion beam etching (IBE).

Thereafter, as shown in FIG. 13, elements such as the interlayer insulating layer 26b, the contact plug TEC, and the bit line BL1 are formed, whereby the MRAM of FIG. 12 to FIG. 14 is completed.

4. Application Example

It is required that a processor used in a personal digital assistant have low power consumption. One of the methods of reducing the power consumption of the processor is a method of replacing a static random access memory (SRAM)-based cache memory having high standby power consumption with a nonvolatile semiconductor memory in which a nonvolatile element is used.

To be specific, the leakage power of an SRAM tends to be greater both during an operating time and a standby (non-operating) time, as a transistor is miniaturized. Thus, by replacing the cache memory with the nonvolatile semiconductor memory, power supply can be shut off during the standby time, and the power consumption during the standby time can be reduced.

Therefore, a low power consumption processor can be achieved by, for example, using the above-described magnetic random access memory (MRAM) as the cache memory.

Figure 17:
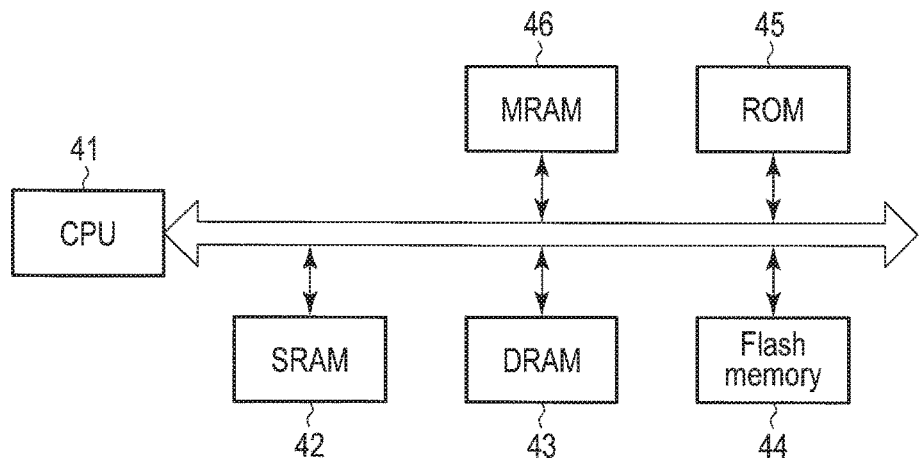
FIG. 17 is a diagram showing an example of a nonvolatile cache system.

FIG. 17 shows an example of a low power consumption processor system.

A CPU 41 controls an SRAM 42, a DRAM 43, a flash memory 44, a ROM 45, and a magnetic random access memory (MRAM) 46.

The MRAM 46 can be used as an alternative to any of the SRAM 42, the DRAM 43, the flash memory 44, and the ROM 45. With this, at least one of the SRAM 42, the DRAM 43, the flash memory 44, and the ROM 45 may be omitted.

The MRAM 46 can be used as a nonvolatile cache memory (for example, an L2 cache).

5. Conclusion

As described above, according to the embodiments, the crystalline texture or the magnetic anisotropy of a magnetoresistive element can be improved. Accordingly, an improvement in the magnetoresistive ratio, a reduction in the magnetization reversal current, and an improvement in thermal stability of the magnetoresistive element can be achieved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A magnetoresistive element comprising:
a first metal layer having a body-centered cubic structure;
a second metal layer having a hexagonal close-packed structure on the first metal layer;
a metal nitride layer on the second metal layer;
a first magnetic layer on the metal nitride layer;
an insulating layer on the first magnetic layer; and
a second magnetic layer on the insulating layer.
2. The magnetoresistive element of claim 1, wherein the first metal layer comprises one of Nb, Mo, Ta, Cr and V.
3. The magnetoresistive element of claim 1, wherein the second metal layer comprises one of Hf, Sc, Y and Zr.
4. The magnetoresistive element of claim 1, wherein:
the metal nitride layer comprises a nitrogen compound or a mixture of the nitrogen compound and an oxygen compound,
the nitrogen compound comprises magnesium nitride, zirconium nitride, niobium nitride, silicon nitride, aluminum nitride, hafnium nitride, tantalum nitride, tungsten nitride, chromium nitride, molybdenum nitride, titanium nitride, or vanadium nitride, and
the oxygen compound comprises magnesium oxide.

5. The magnetoresistive element of claim 1, wherein each of the first and second magnetic layers comprises Co and Fe, and the insulating layer comprises magnesium oxide.

6. The magnetoresistive element of claim 3, wherein:
   each of the first and second magnetic layers has a body-centered cubic structure in which a film surface is orientated in a (001)-surface, and
   the insulating layer has an NaCl structure in which a film surface is orientated in a (001)-surface.

7. The magnetoresistive element of claim 1, wherein the first metal layer has a thickness of 0.5 nm or more and 4.5 nm or less.

8. The magnetoresistive element of claim 1, wherein the second metal layer has a thickness of 2 nm or more and 20 nm or less.

9. The magnetoresistive element of claim 1, wherein the metal nitride layer has a thickness of 0.4 nm or more and 2 nm or less.

10. The magnetoresistive element of claim 1, wherein the metal nitride layer has a hexagonal close-packed structure.

11. The magnetoresistive element of claim 1, wherein the first magnetic layer has variable magnetization direction, and the second magnetic layer has invariable magnetization direction.

12. The magnetoresistive element of claim 11, further comprising:
   a third metal layer on the second magnetic layer; and
   a third magnetic layer having invariable magnetization on the third metal layer,
   wherein the second and third magnetic layers are SAF-coupled to each other.

13. The magnetoresistive element of claim 1, further comprising:
   a third metal layer under the first metal layer,
   wherein the third metal layer has a crystal structure or an amorphous structure.

14. The magnetoresistive element of claim 1, wherein each of the first and second magnetic layers has an axis of easy magnetization in a direction perpendicular to a film surface.

15. The magnetoresistive element of claim 1, wherein each of the first and second magnetic layers includes an element selected from a group of Mo, W, Ta, Zr, Hf, Cr and V.

16. A memory device comprising:
   a semiconductor substrate;
   a select transistor on the semiconductor substrate; and
   the magnetoresistive element of claim 1 above the select transistor, the magnetoresistive element being connected to the select transistor.

17. A magnetoresistive element comprising:
   a first metal layer comprising one of Nb, Mo, Ta, Cr and V, and having a body-centered cubic structure;
   a second metal layer on the first metal layer, the second metal layer comprising one of Hf, Sc, Y and Zr, and having a hexagonal close-packed structure, wherein the second metal layer is in direct contact with the first metal layer;
   an aluminum nitride layer on the second metal layer;
   a first magnetic layer on the aluminum nitride layer;
   an insulating layer on the first magnetic layer; and
   a second magnetic layer on the insulating layer.

* * * * *